(12) United States Patent
Ferren et al.

(10) Patent No.: US 8,907,897 B2
(45) Date of Patent: Dec. 9, 2014

(54) OPTICAL CAPACITIVE THUMB CONTROL WITH PRESSURE SENSOR

(75) Inventors: Bran Ferren, Beverly Hills, CA (US); Charles F. Harrison, Seattle, WA (US)

(73) Assignee: Intel Corporation, Santa Clara, CA (US)

(*) Notice: Subject to any disclaimer, the term of this patent is extended or adjusted under 35 U.S.C. 154(b) by 1146 days.

(21) Appl. No.: 12/650,582

(22) Filed: Dec. 31, 2009

(65) Prior Publication Data

US 2010/0315337 A1  Dec. 16, 2010

Related U.S. Application Data

(60) Provisional application No. 61/187,520, filed on Jun. 16, 2009, provisional application No. 61/265,726, filed on Dec. 1, 2009.

(51) Int. Cl.
*G06F 3/033* (2013.01)
*G06F 3/0354* (2013.01)
*G06F 3/042* (2006.01)
*G06F 1/16* (2006.01)
*G06F 3/041* (2006.01)
*G06F 3/0338* (2013.01)
*G06F 3/044* (2006.01)

(52) U.S. Cl.
CPC ............ *G06F 3/044* (2013.01); *G06F 3/03547* (2013.01); *G06F 3/042* (2013.01); *G06F 1/169* (2013.01); *G06F 2203/0339* (2013.01); *G06F 2203/04105* (2013.01); *G06F 3/0414* (2013.01); *G06F 3/0338* (2013.01)
USPC ........... 345/158; 345/173; 345/207; 250/330; 250/339.11; 250/339.14; 250/341.8; 250/342; 250/578.1; 257/227

(58) Field of Classification Search
USPC .............. 345/173, 174, 207; 250/330, 578.1, 250/339.11, 339.14, 341.8, 342; 257/227
See application file for complete search history.

(56) References Cited

U.S. PATENT DOCUMENTS

| 6,208,328 B1* | 3/2001 | Kawachiya et al. .......... 345/157 |
| 6,677,929 B2 | 1/2004 | Gordon et al. |
| 7,738,916 B2 | 6/2010 | Fukuda |

(Continued)

FOREIGN PATENT DOCUMENTS

| JP | H02265124 | 10/1990 |
| JP | 09-237158 A | 9/1997 |

(Continued)

OTHER PUBLICATIONS

Machine translation of Japan Publication 09237158 on Sep. 9, 1997 by Ishihara Kazuyuki.*

(Continued)

*Primary Examiner* — Jason Olson
*Assistant Examiner* — Linh N Hoffner
(74) *Attorney, Agent, or Firm* — Kacvinsky Daisak Bluni PLLC

(57) ABSTRACT

A small sensor surface designed to control a smart phone or Mobile Internet Device (MID). The sensor surface may be mounted on the side of the proposed device in a position where a user's thumb or finger naturally falls when holding the device in his/her hand. The sensor surface is simultaneously convex and concave, providing both visual and physical cues for the use of the sensor surface. The sensor may include capacitive sensing, optical sensing and pressure sensing capabilities to interpret thumb gestures into device control.

15 Claims, 13 Drawing Sheets

Front Exploded View

(56) References Cited

U.S. PATENT DOCUMENTS

| | | | |
|---|---|---|---|
| 8,018,431 B1* | 9/2011 | Zehr et al. | 345/156 |
| 8,049,731 B2 | 11/2011 | Baker et al. | |
| 8,217,902 B2 | 7/2012 | Chang et al. | |
| 8,279,181 B2 | 10/2012 | Kanno | |
| 2004/0125947 A1 | 7/2004 | Charlier et al. | |
| 2004/0263479 A1 | 12/2004 | Shkolnikov | |
| 2005/0184953 A1 | 8/2005 | Camp, Jr. et al. | |
| 2006/0197750 A1* | 9/2006 | Kerr et al. | 345/173 |
| 2006/0267940 A1 | 11/2006 | Groom et al. | |
| 2007/0264743 A1* | 11/2007 | Vaganov et al. | 438/51 |
| 2008/0163121 A1* | 7/2008 | Lee et al. | 715/845 |
| 2009/0051659 A1 | 2/2009 | Mickelborough | |
| 2009/0079698 A1 | 3/2009 | Takashima et al. | |
| 2009/0128511 A1 | 5/2009 | Sinclair et al. | |
| 2010/0134424 A1* | 6/2010 | Brisebois et al. | 345/173 |
| 2010/0137031 A1* | 6/2010 | Griffin et al. | 345/173 |

FOREIGN PATENT DOCUMENTS

| | | | |
|---|---|---|---|
| JP | 2001-350579 A | 12/2001 | |
| JP | 2006-099791 A | 4/2006 | |
| JP | 2006120009 | 5/2006 | |
| JP | 2009-026151 A | 2/2009 | |
| TW | 200809588 A | 2/2008 | |
| TW | 200810501 A | 2/2008 | |
| TW | 200830160 A | 7/2008 | |
| WO | 00/55716 A1 | 9/2000 | |
| WO | 2009/032304 A1 | 3/2009 | |
| WO | 2009/035212 A1 | 3/2009 | |
| WO | 2010/147704 A1 | 12/2010 | |
| WO | 2010/147704 A9 | 2/2011 | |

OTHER PUBLICATIONS

International Search Report and Written Opinion received for PCT Patent Application No. PCT/US2010/032973, mailed on Nov. 18, 2010, 9 pages.

Search Report for European Patent Application No. 10789898.3, mailed on Dec. 20, 2012, 14 pages of European Search Report.

Office Action received for Taiwanese Patent Application No. 099114063, mailed on Apr. 3, 2013, 8 pages of Taiwanese Office Action and 7 pages of English Translation.

Office Action received for Japanese Patent Application No. 2012-516086, mailed on Jun. 4, 2013, 2 pages of Japanese Office Action and 2 pages of English Translation.

International Preliminary Report on Patentablility received for PCT Patent Application No. PCT/US2010/032973, mailed on Dec. 16, 2011, 5 pages.

Office Action received for Korean Patent Application No. 10-2011-7031577, mailed May 20, 2014, 9 pages including 4 pages English translation.

* cited by examiner

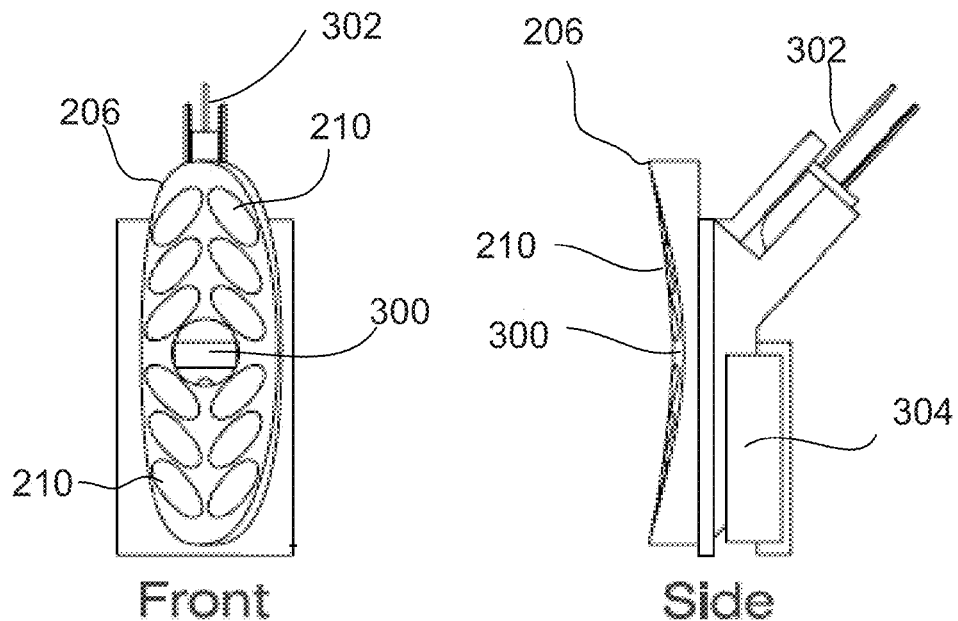
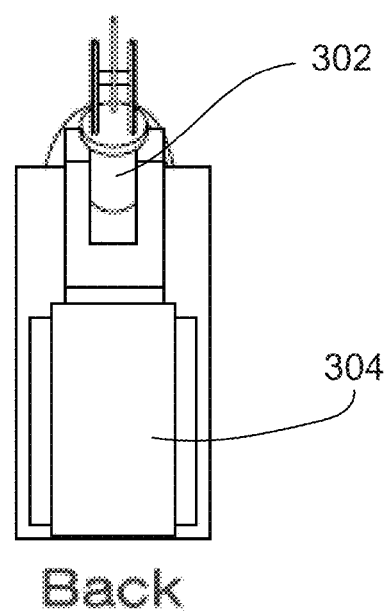
Fig. 3A    Fig. 3B
Fig. 3C

Front Exploded View

Back Exploded View

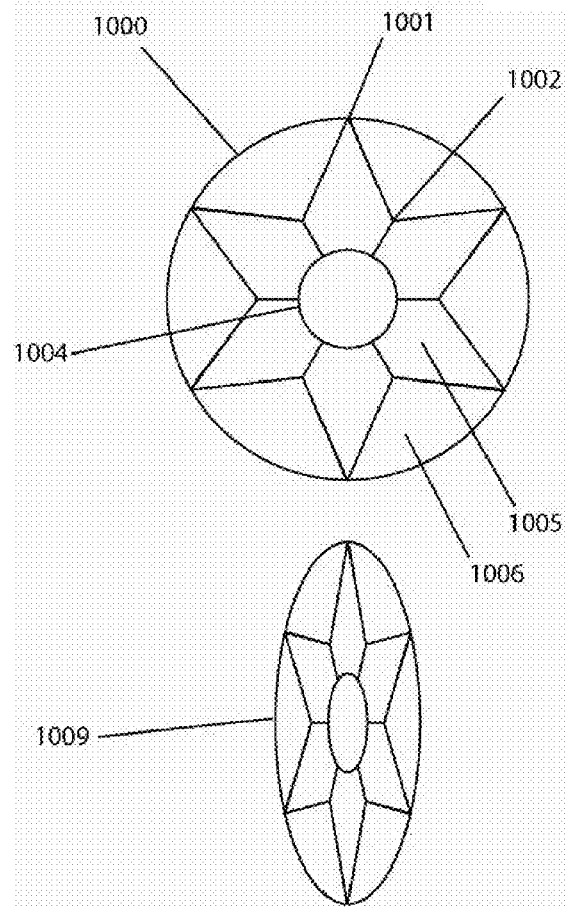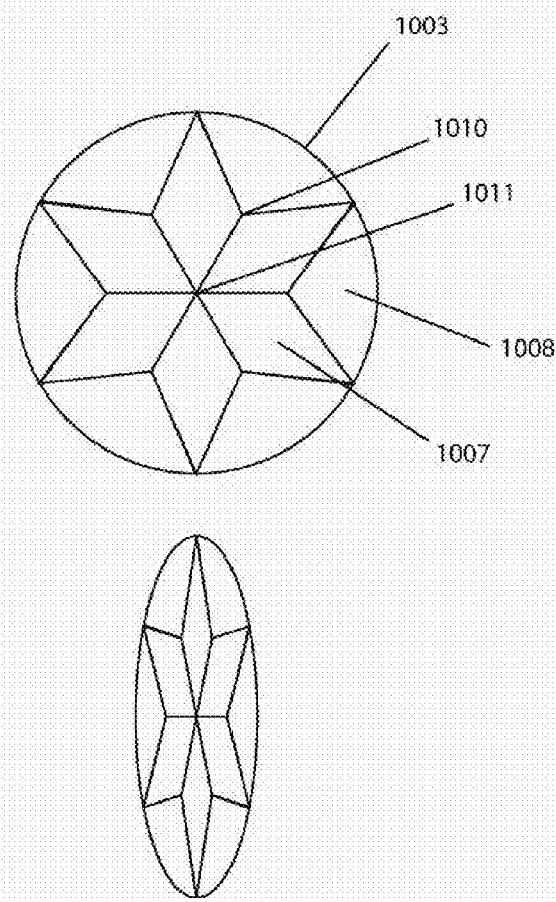
Fig. 10A  Fig. 10B
Fig. 10C  Fig. 10D

OPTICAL CAPACITIVE THUMB CONTROL WITH PRESSURE SENSOR

CROSS-REFERENCE TO RELATED APPLICATIONS

This application is related to and claims priority to U.S. Provisional Application Ser. No. 61/187,520 titled MULTI-MODE HANDHELD ELECTRONIC DEVICE, filed on Jun. 16, 2009 and on U.S. Provisional Application Ser. No. 61/265,726 titled UNIPOINT SENSOR DEVICE, filed on Dec. 1, 2009, both herein incorporated by reference.

FIELD OF THE INVENTION

Embodiments of the present invention are directed to input devices for handheld computing platforms and, more particularly, to a thumb control device with pressure and optionally optical sensors.

BACKGROUND INFORMATION

Hand-held wireless devices, such as cellular telephones, Personal Digital Assistants (PDAs), and more recently the new generation of mobile internet devices (MIDs) and smart phones are gaining widespread acceptance. In order to be competitive in the marketplace and to meet consumer demand, service providers continue to offer an ever expanding array of services and features.

PDAs, or more generally hand-held computers, were originally designed for use as personal organizers for storing notes, contact information, calendar dates and so forth. The current generation of MID hand-held devices additionally incorporates wireless and cellular technology and act as a phone for voice communications. Further, many allow users to access a variety of information and include services and features such as internet browsing, global positioning system (GPS) maps and driving directions, instant stock quotes, entertainment locators, email service, and a variety of multi-media music and video capturing and playback capabilities, to name a few.

Since such hand-held devices are by their nature small, command input has been challenging. Early generations of these devices used physical keys to type in data and commands. More recently, very good touch screens have been developed. However, whether physical keys or virtual keys on a screen they tend to be small and sometimes hard to navigate. Sometimes a stylus or other pointing stick may be used if the user's fingers is too big or lacks the necessary dexterity to hit the correct key. Further, keyboards and touch screens may be difficult to hold and operate with just one hand, even for inputting just basic functions. Thus an easier to operate input devices for mobile devices would be welcome.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

FIGS. 3A-3C are front, side, and back views, respectively, of another embodiment of the present invention including an optical sensor;

FIGS. 10A-10D are planar view illustrations of a radial sensor pattern with interleaved polygonal electrode plates, with and without optical aperture;

FIGS. 11A-11D are planar view illustrations of a grid sensor pattern with sensor area division along axis lines, with and without optical aperture;

DETAILED DESCRIPTION

Described is a small sensor designed to control a smart phone or Mobile Internet Device (MID). The sensor surface may be mounted on the side of the hand-held device in a position where a user's thumb naturally falls when holding the device in their hand. The sensor surface may be concave, providing both visual and physical cues for the use of the sensor surface. The sensor is designed such that pointing, selection and control gestures are intuitive and low fatigue.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figures 1A, 1B:
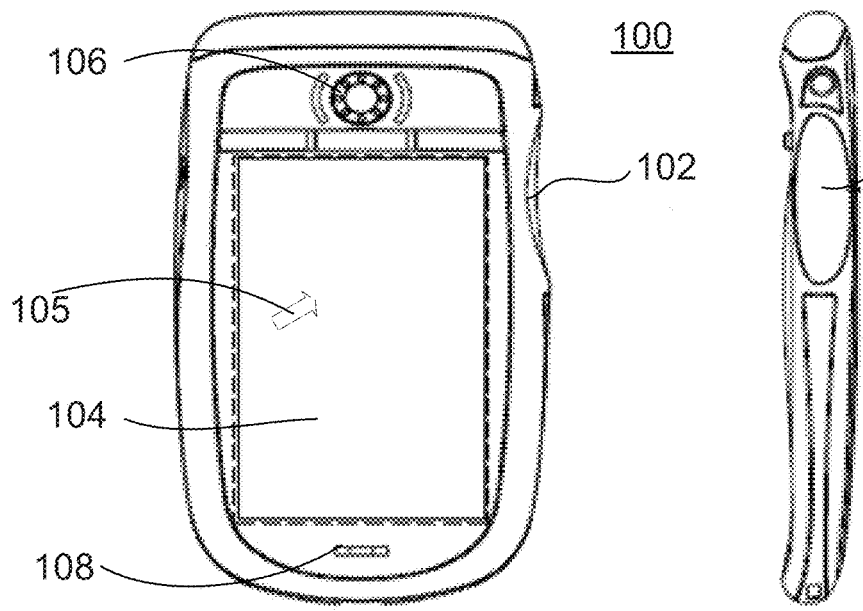
FIGS. 1A and 1B are front and side views, respectively, of a mobile internet device (MID) including the thumb sensor of the present invention.

Referring now to FIGS. 1A and 1B, there is shown a front and side view, respectively, of an illustrative mobile internet device (MID) 100 including one embodiment of the thumb sensor 102 of the present invention. The MID 100 may include such features as a display screen 104, which may be a touch-type screen, as well as speaker 106 and mouth piece 108 for phone functions. Of course any other functions found on a MID device may also be present, though not necessarily discussed.

The thumb sensor 102 is shown located towards the upper right side of the MID 100. Of course, it may also in some embodiments be located on the other side of the MID, for the convenience of left handed users. In this position, the user's thumb naturally falls on the sensor 102 when holding the device 100 in their hand.

The thumb sensor 102 may provide several forms of control over the MID device 100. The first allows users to control "pointing" strictly through sliding motions of the thumb on the sensor 102 surface. This pointing may of course correspond to some action, such as cursor 105 movement on the display screen 104, movement of a text editing caret, or movement of a selection indicator.

The second allows for "selection" functionality, associated with the location of the pointer, cursor, or caret. The selection function is accomplished either by physically depressing the sensor 102 with the thumb, or by executing a light tapping gesture on the sensor surface.

Finally, the user can execute "flicks" in either the vertical or horizontal direction. These flick gestures may be mapped to control email packages, web browsers or document viewers/editors.

Additional examples of applications of the "pointing" capability of the sensor 102 include scrolling or rotating a display vertically and horizontally, scrolling through a document or web page, moving a selection cursor or an edit caret through a text or web document, rotating a 3D view such as in a video game or virtual environment, finely controlling the pan, tilt, and zoom of an articulating real or virtual camera, fine pan & zoom control on an interactive map, or fine pan and zoom control of a digital photo.

Other specific uses of flick gestures include flipping through sets of images which have been organized into horizontal and vertical categories, executing rotation of user interface elements at fixed degree intervals, or switching between applications or windows.

One method for detecting flick gestures is as follows. Motion of the thumb on and near the sensor over time may be tracked and recorded to form a gesture path in three dimensions. The flick gestures may be algorithmically distinguished from fine position control by measuring the velocity of a given and complete motion path relative to a configurable threshold. The motion path may be considered complete based on spatial analysis of a three dimensional motion path, particularly on the basis of the existence of beginning and ending conditions for the gesture, which may include detecting a touch against the surface, followed by a motion, followed by a release of touch. If the configurable velocity threshold is exceeded in a given direction by a given motion, then that motion gesture may be considered to be a strong directional flick gesture. The strength of the motion is mapped into varying degrees of control of user interface elements, such as modulating the rotational speed of a three dimensional user interface object.

Another method of detecting gestures in the system is by utilizing a trained dataset and pattern classification techniques. One embodiment of this approach is a specialized Support Vector Machine (SVM). This technique partitions the space of gestures and motions with a set of hyper-planes in the N-space defined by the arity of inputs to the SVM. For example, the SVM may track initial sensor reading, last sensor reading, medial sensor reading, mean velocity, maximum velocity, "pressure" RMS, and then compute the classification in 6-space. The SVM as described can also utilize optical data as part of its state-space (by expanding the described arity), rather than depend on already fused sensor data.

The SVM recognizer can be used directly as well as with recursive boosting and Recursive Feature Elimination (RFE) to increase detection accuracy. A specific feature of utilizing trained data in the gesture engine is that it may be retrained to support an atypical user.

All methods of gesture detection may be used singularly or in conjunction with another method as a hybrid method of gesture detection.

Pointing and tracking data is typically processed at multiple points in the software acquisition chain. The specific embodiment may vary, but a typical instantiation has a pre-filter, a primary filter, and a secondary (or output) filter. The purpose of the pre-filter is normally to prepare raw data samples for use in the primary filter by both characterizing the sensor and applying any simple transform to move from the raw sensor reference frame to the reference frame in use by the primary filter. The primary filter is designed to remove noise from individual samples. Finally, the output filter typically applies a transform to the primary filter output to make the data more appropriate for direct usage.

When the embodiment of this invention is a hybrid optical and capacitive sensor, the optical and capacitive data should also be fused to the same coordinate system. This may be handled at different points in the filter chain depending on the specific embodiment of the sensor device. In one particular embodiment, the optical data has a separate pre-filter from the capacitive filter and is hybridized with the capacitive data only during the primary filter.

One embodiment of a primary filter is an adaptive infinite impulse response (IIR) filter, the absolute tracking position of the device may be finely controlled by using slower, more deliberate thumb or finger motions. Equally possible are large sweeping motions of the same pointer position. The adaptive filter dynamically adjusts the degree of filtering based on the measured velocity of the motion made on the sensor surface. The filtered absolute position, Pnew, can be computed with an IIR filter, given an absolute unfiltered position Praw, a previous filtered position Pprevious, and a filter factor f, as $$Pnew=f*Praw+(1-f)*Pprevious.$$

The filter factor, f, continuously varies between 0 and 1, and affects the degree of filtering, or dampening of tracked motion. When f is at or near 1, filtering is disabled, motion is quickened, and noise increases. When it is at or near 0, filtering is at or near its maximum, noise is reduced, and motion is slowed or halted.

The filter factor f is dependent on the output of a relative velocity decay function, F. This decay function F, in general, maps rapid user finger or thumb motion to lower values of f, and maps slower user motion to higher values off. The value of f will decay exponentially with time as the thumb or finger slows or halts its motion, so as to finally settle into a value at or near 1. On the other hand, if the user's actual tracked motion (Praw) is relatively rapid, then filtering may be decreased or disabled due to the output of F approaching or reaching 1. f is treated as a position in a dampened point mass physical system undergoing acceleration and deceleration. Under this system, rapid user motion corresponds to acceleration of the positional representation f toward 1, while slower motion will reduce or eliminate the acceleration effect. The positional representation of f is influenced by a constant deceleration toward 0. In this system, deceleration towards 0 is a time-dependent function which is controllable by the user through quickness or slowness of motion. The effect of an f value near 0 is a high degree of filtering, and a corresponding increase in the ability of the user to move in progressively finer increments. The effect of a value at or near 1 is that of reducing the effects of, or disabling the IIR filter. When filtering is reduced or disabled, gross or quick motion is possible. Reducing filtering also increases noise, but, in general, gross motion is more accommodating of noise than smaller, careful motion, so, in practice, and with proper tuning of parameters, the noise is not discernable to the user. The adjustable function parameters may be tuned such that moving with intent and precision between characters in a body of text with an edit caret, or between screen pixels with a pointer, is possible with the device, without significantly impeding gross motion across the display screen.

The adaptive filter is designed to solve a problem inherent in the nature of the thumb sensor system. The problem is related to the comparative size difference between a thumb or finger and the sensor surface. If a single filtering level is chosen, rather than a dynamic scheme, then a value selected which is optimal for fine pixel or text cursor positioning may be too slow for large motions intended to move the cursor across the entire screen or across a large body of text. Similarly, a factor that is chosen which is optimal for large motions may prove impossible to use for fine control. An additional benefit of dynamically controlling the filter parameter is to avoid dampening the user's lighter, quicker motions with an inappropriately high degree of filtering. The output of this adaptive filtering scheme may be used throughout a user interface to improve the sense of control for all applications involving positional movement.

Another primary filter embodiment comprises utilizing a multi-pole multi-tap finite impulse response filter (FIR). This embodiment allows the sensor to be more clearly frequency selective than a IIR implementation, and eliminates the instability of IIR implementation. For an FIR filter implementation the coefficients are calculated based on the measured signal/noise characteristics of the system.

A FIR embodiment can make use of similar extensions as the IIR filter methodology to form an adaptive filter system.

Additional primary filter embodiments may be useful. Some embodiments that have valuable properties are, in general, predictive filters, and Kalman/extended Kalman filters, particle filters in specific. In these embodiments, a predictive motion model is used to inform the underlying system in order to aid the calculation of state and reduce response lag. They are also useful in hybridization of optical and capacitive data.

In addition to the primary filter, a secondary filter may be applied, e.g. to improve the stability of cursor tracking for mouse-like screen pointer usage models. A filtered point may be passed through an additional acceleration curve. This curve maps the primary filtered pointer velocities V to adjusted pointer velocities V'. A desirable property of a pointer input system is linearity of response to user input. In order to accomplish linearity, while still allowing for acceleration which is dependent on motion, a curve which combines two linear segments may be used.

One embodiment of secondary filtration is to utilize a Bezier curve to smoothly connect two linear acceleration segments which represent two velocity mapping values at low and high speed. Using connected linear segments avoids the undesirable property of typical mouse acceleration curves which require the user to spatially operate in a velocity space which is curved everywhere. This is similar to requiring a user to draw straight lines on the surface of a ball. This second layer of filtering is important in stabilizing a cursor pointer on screen pixels or other fine detail elements.

Another embodiment of secondary filtration is a hyperbolic tangent (or other smooth differentiable function) ballistics curve. Other curves may be used to support this functionality which maps a flat velocity space into a curved velocity space designed to allow a user to have both fine and coarse pointer control.

Computation of the unfiltered tracked thumb or finger point as part of the system pre-filter or raw data may be accomplished by several unique algorithms. The first is described by considering each electrode plate as a point in space, then computing the weighted sum of each point multiplied by its capacitance measurement. In analogue to a physical system, capacitance is treated as a measurement of mass, and individual electrode sensors represent samples of mass at discrete points. Within this analogue, the center of mass or charge is a good approximation to the position of a massive object, such as a finger or thumb, in the presence of, and affecting, an electromagnetic field.

A variant of this center of mass computation may involve using measurements of mutual capacitance by specifically selected pairs of electrodes. These pairs may be selected in sequence, and their measurements may be aggregated to form a spatial map of the capacitive field in the presence of an object such as a finger or thumb. Pairs of electrodes give capacitive measurements that are most strongly affected by the presence of objects that lie directly between them. Multiple measurements can be taken between pairs of electrodes that are placed spatially such that coverage of the full thumb sensor surface 102, by portions of space directly or approximately between pairs, is made in the aggregate. A more detailed three dimensional mapping of the presence and position of an object, such as a finger or thumb, may be made by combining a sequence of successive pair measurements. With more information about the size, shape, and volume of an object, taken in close proximity with the sensor surface 102, better overall positional results can be had by the device, which take into account various cases which are degenerate to classical touchpad algorithms.

A second variant utilizes a similar method to the center of mass computation, but uses an inverse square law as the distance factor in order to emphasize small changes in position, thus allowing better utilization of the small sensor area.

A pre-filter may also contain a debiasing method designed to automatically track differences in the individual sensor plate sensitivity or responsiveness. Any number of different debiasing algorithms or techniques may be used.

One example of a debiasing algorithm is row-column debiasing. In this method, the capacitive plates are normalized by for each plate tracking the lowest observed value ($B_i$ where i is the channel number) of each channel, a maximum above $B_i$ value, $Max_i$, for each channel, a global minimum, M, for any particular reading set, and a global normalization constant $M_{norm}$. At each sensor reading, $B_i$ is updated and subtracted off of the raw reading to form $W_i$, then $Max_i$ is updated. At this point, M is updated with the minimum debiased reading from the set, and $M_{norm}$ is updated to be the smallest ratio of ($W_i/Max_i$). The point position is then calculated via one of the centroid calculation methods using either $W_i$ or the normalized ($W_i/Max_i$)−$M_{norm}$.

Some capacitive touchpad algorithms do not place emphasis on consideration of a flattened thumb or finger against a capacitive sensor array surface. The result is inaccurate or ambiguous positional information when flat or broad objects make contact with the sensor surface. Since the contact surface area is predominantly significant, for the computation of position, in existing capacitive touchpad algorithms, there may be large inaccuracies or unintended motion due to rolling or shifting of a broad or flat object making contact with the sensor surface. This use case, which is considered degenerate in conventional trackpad devices, becomes the common case in a thumb sensor device 102. A combined hybrid optical capacitive system may solve this problem. Optionally, a pure capacitive thumb sensor system may use a novel algorithm which can gather higher order data about the thumb or finger in order to unambiguously distinguish the degenerate case. A novel algorithm may analyze, in three dimensions, the volumetric orientation of a thumb or finger against the sensor surface. In doing so, the inaccuracy or ambiguity associated with the degenerate case, present in conventional touchpad systems, may be avoided by interpreting the higher order data.

A method of interpretation of a volumetric dataset may be, through numerical optimization, assigning a best-fit mathematical model of a representation of a thumb or finger to the volume. This mathematical model may have distinct articulation points, such as in the case of a three-dimensional ellipsoid, which has two focal points, one of which may be considered as a thumb or finger tip. In another model, a cylinder or tube may be used as an approximation, in which case, one end of the tube, offset inwardly with a particular radius, commensurate with the width of the thumb or finger, may be considered as a thumb or finger tip. Even with a flat thumb or finger, approximated as an ellipsoid, the upper foci, represented in this manner as a thumb or finger tip, will remain in a location that is more constant and consistent with the position of the tip of the user's thumb or finger than in a conventional touchpad system.

In a conventional trackpad system, with the case of a flat or rolling thumb or finger, the resulting interpreted position would vary wildly, completely dependent on the specific point or area of surface contact made by the thumb or finger against the sensor surface, even though the user's intended representative control point may have been at or near their thumb tip or fingertip. In this way, a volumetric or three dimensional algorithmic approach to capacitive data, as measured by existing sensor subsystems, is critical to the overall usability of the thumb sensor device in its predominant configuration.

Figures 14A, 14B, 14C:
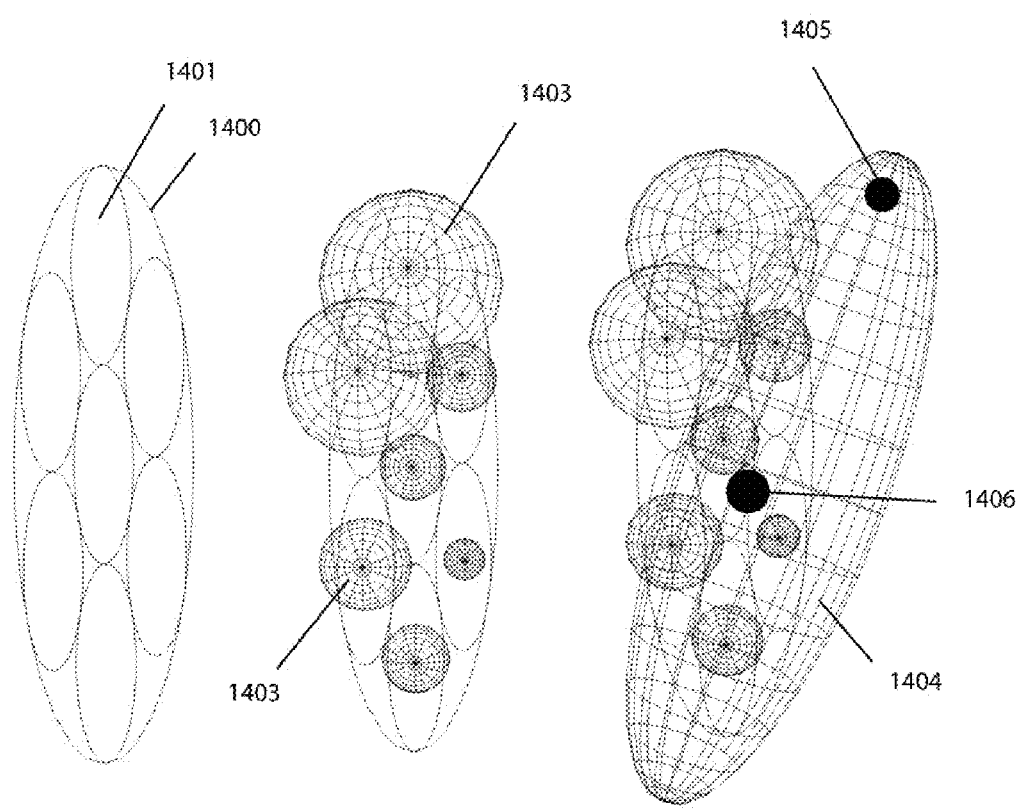
FIG. 14A-14C show the thumb sensor and illustrate a three dimensional orientation sensing approach of a thumb or finger in order to derive enhanced positional information.

Referring to FIG. 1B, and FIGS. 14A, 14B and 14C, an algorithmic approach may be described by which a three dimensional orientation of a thumb or finger may be sensed and distinguished in order to derive enhanced positional information. FIG. 14A depicts a typical capacitive sensor arrangement. In this example, which can operate with other sensor electrode arrangements, a thumb sensor surface 102, represented in planar form 1400, bears a collection of capacitive electrode plates 1401 arranged in a radial honeycomb fashion. FIG. 14B depicts a visualization of example capacitive sensor measurement data represented as volumetric spheroids 1403 situated in or on a sensor surface space 1400 corresponding to each of the positions of individual capacitive electrodes 1401. These spheroids represent measurement of approximate distance to an object on or near a sensor surface, such as a finger or thumb. The distance is computed based on a classic formula for the relationship between distance, area and capacitance, in a parallel plate capacitor system. This formula is $C=A/d$. In this manner, a distance term may be approximately obtained from each sensor electrode. FIG. 14C is an illustration which depicts a method by which we may derive the approximate orientation of a geometrical model 1404 of a thumb or finger, modeled as an ellipsoid, a tube, an articulating collection of linked and jointed spheroids, or other geometric object representational of, and analogous to, a thumb or finger. Using numerical fit methods, the three dimensional position and angular orientation of a geometric thumb model 1404 may be arranged into the manifold defined by the aggregate collection of spheroids 1403 derived from sensor measurements. When the approximate three dimensional position and orientation of a thumb or finger geometric model is obtained through numerical fit, we may now assign an arbitrary point within or near that geometry which serves as a representational point within a user interface. Similarly, information regarding angle or distance may be inferred from the geometrical model. If an ellipsoid is chosen to represent the thumb or a segment thereof, one of the foci 1405 of said ellipsoid may be chosen as the representational point within the user interface. This point is significantly more intuitive, with respect to the tip or index of the thumb or finger, than the point which would result from a conventional touchpad algorithm, the location of which is approximately given at 1406. This improved representational point 1405 may be input to subsequent filter stages or used as an initial guess in subsequent cycles of a numerical fit system. This novel method addresses many of the problems associated with a flat thumb or finger against a capacitive sensor field, by performing spatial analysis in three dimensions, rather than conventional analysis of a two dimensional contact point or centroid of contact area against a sensor surface 102. Although not limited to the particular design depicted in FIG. 14, the regular arrangement and elliptical shape of the individual electrode plates 1401 improves results of approximation of sensor measurements as distance, which permits representation as a field of spheroids. It should be understood that this particular algorithm can operate with a variety of sensor designs, including radial, grid, and other arrangements.

An adaptation of the previous algorithm represents a thumb modeled as a skeletal system composed of three carpal segments connected by two articulating joints. These carpal segments may be approximated by ellipsoids or spheroids connected by algorithmic linkages which restrict the motion of the thumb or finger system to constraints which are derived from the articulation limits inherent in a human thumb or finger joint. The three dimensional volumetric analysis described previously may be further enhanced by the adoption of the fully articulating geometric model, and provides further information regarding the orientation of the thumb or finger with regard to the sensor surface 102. This information may be critical in order to stabilize positional data with respect to conventionally degenerate or immeasurable cases present in existing touchpad systems.

Figure 2A:
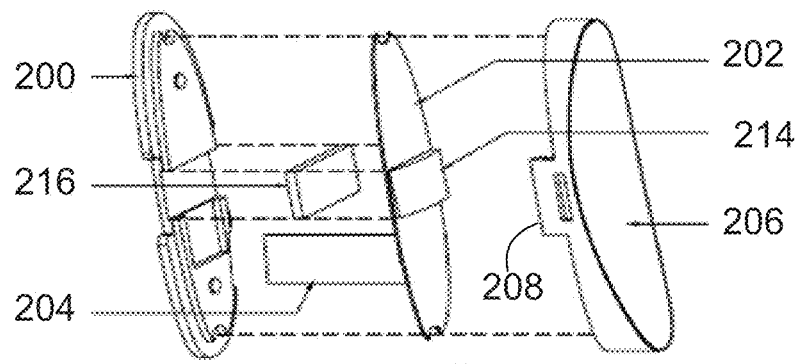
FIGS. 2A and 2B are front and rear, respectively, exploded views of one embodiment of the thumb sensor of the present invention.
Figure 2B:
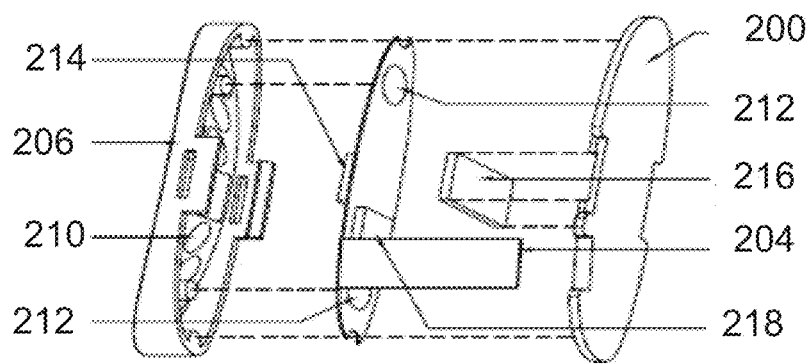

Referring now to FIGS. 2A and 2B, there are shown front and back exploded views, respectively, of the thumb sensor according to one embodiment. The thumb sensor may include a sensor base 200 onto which a printed circuit board (PCB) 202 or conditioning board may be seated. The PCB 202 may have a flex connector lead 204 to route electrical signals off of the PCB 202. A sensor cover 206 may be generally oblong oval in shape with a concave surface to comfortably accommodate the pad of a human thumb. In one embodiment a clip 208 may be provided to secure the cover 206 to the sensor base 200 when assembled. The sensor cover 206 may comprise a plurality of sensors 210 to sense the movement and gestures of a thumb. In one embodiment, the plurality of sensors 210 may be an array of capacitive sensors as previously described.

One or more tactile switches or dome switches 212 may also be provided. In one embodiment, two dome switches may be provided, one located near the top of the sensor cover 206 and one near the bottom. If the switches themselves do not have enough spring-back, springs may be added to return the pad to its original position. Signals from the sensors may be routed to a central connector such as a zebra strip connector 214. Generally speaking, a zebra strip connector 214 is a packaging device that allows quick alignment of electronic devices on a printed circuit board 202. It may comprise a small rubber strip with carbon bands running around it that allows contact to be made from pads on the board to the pads on sensors 210 by whichever bands happen to line up at both points. A zebra connector support 216 may be provided on the opposite side of the PCB 202 to add support. A chip 218 may be provided to organize the sensor data for off-device processing via the flex connector 204.

The capacitive sensor pads 210 may be deposited onto the interior of the sensor's thumb surface. The capacitive sensor utilizes a plurality of individual capacitive sensors arranged in various novel patterns designed to optimize the capacitive field depending on the selected algorithm in use. The tactile or dome switches 212 are attached underneath this surface, so that the user can "point and click" in one quick motion by rolling and applying pressure at the appropriate time.

As before noted with reference to FIG. 1, a MID 100 may be fitted with the sensor preferably along a long edge of the device (i.e. the left or right side of the device when held in an upright configuration). The user brushes his thumb or finger across the surface of the sensor 102 to provide two-dimensional input (i.e. x-y input) to control, for example, a cursor 105 location on the display 104. The touch surface 102 may be additionally equipped with a pressure-sensing mechanism. At a minimum, the pressure-sensing mechanism determines if the pressure applied by the user is above or below a predetermined threshold. The thumb interface thus provides "2.5D" input—scalar inputs along two dimensions (x and y) and a Boolean input along a third dimension.

The Boolean input may be used to provide "click" (e.g. selection) or "enter/accept/next" functionality. By monitoring the duration of Boolean inputs, the device can distinguish between "clicks" and "sustained presses". In one control scheme, a single tap will awaken the device from a power-saving state. Once awoken, a single-click may then be used to select an object and a double-click to deselect the object. A sustained press can be used to anchor a highlighting operation. Subsequent x-y input defines the highlighted region, with a second sustained press ending the highlighting operation.

Alternatively, the user may highlight a region by maintaining contact pressure above the predetermined threshold throughout the movement defining the highlighted region, i.e "dragging". In other contexts, a double-tap is used to navigate "Back" through a hierarchical menu structure. If the pressure-sensing mechanism provides a true scalar measure of the applied pressure, full 3D control can be achieved. In this case, the measured pressure input may be mapped to any of a number of functions, such as magnification of the displayed content, zooming, or navigation through the depth dimension of a three dimensional image.

In another embodiment, the invention may also be applied to a thumbwheel control. A contact switch or force sensor mechanically coupled to the rotating thumbwheel yields 1.5D or 2D input that can be utilized as described above.

FIGS. 3A, 3B, and 3C show front, side, and back views, respectively, of another embodiment of the inventive thumb sensor which additionally comprises optical sensing. Of course this may also be used with the MID shown in FIG. 1. As before, the thumb sensor may include a cover 206 that bears a simultaneous concave and convex elongated oval or "saddle" shape and may comprise an array of capacitive sensors 210 as previously described. Additionally, a window or aperture may be provided to allow for an optical sensor 300. In one embodiment, the optical sensor 300 may comprise a light source, such as a light emitting diode (LED) 302 or laser. Additionally, light detection circuitry 304 may be provided to monitor changes in the detected light to determine thumb movement. The selected optical spectral range may include any wavelength including visible or infrared light.

Figure 4:
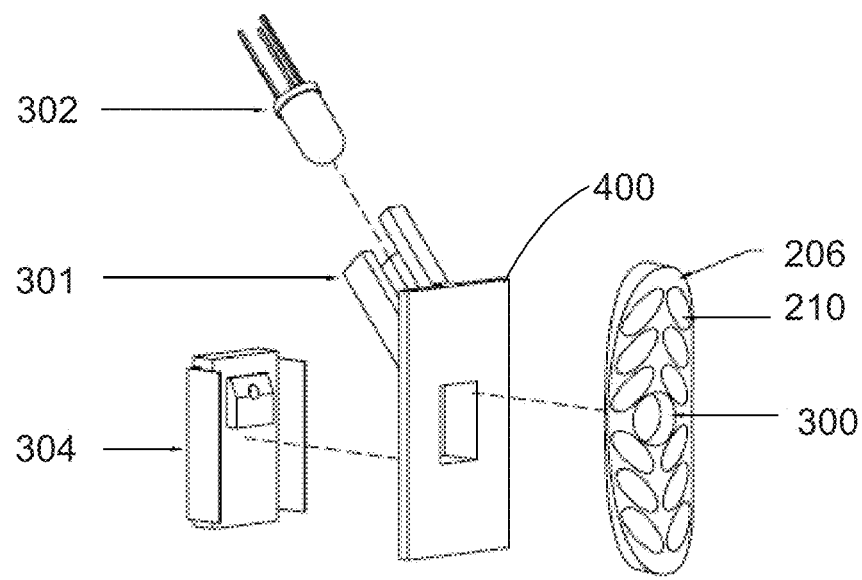
FIGS. 4 and 5 are front and back, respectively, exploded views of the device shown in FIGS. 3A-3C.
Figure 5:
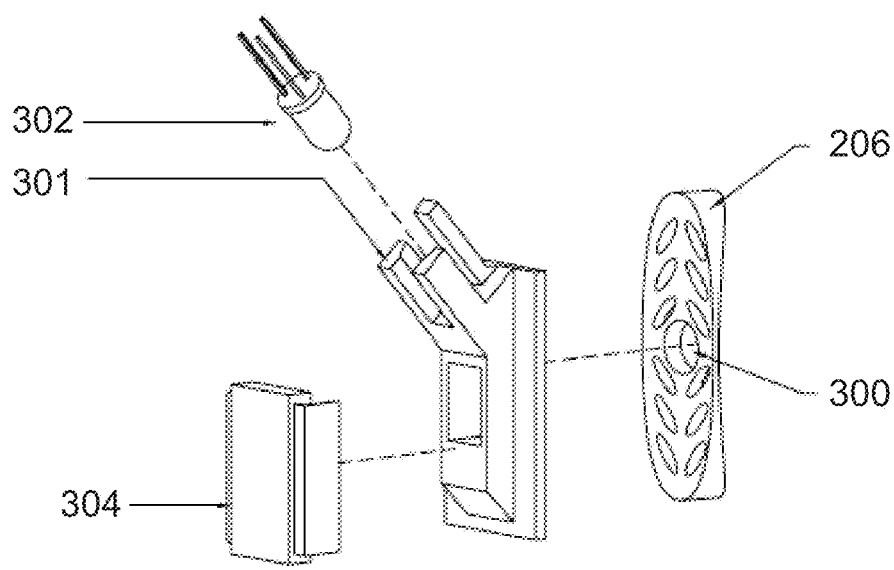

FIGS. 4A and 4B, shows front and back exploded views, respectively of the thumb sensor shown in FIGS. 3A and 3B. As shown, the cover 206 including the capacitive sensors 210 and the window 300 for the optical sensor. A holder 400 may hold the light source 302 at an angle to the window 300. The holder may include a prism 301. The light detector 304 may similarly sit in back of the holder 400 to detect movement of a thumb across the sensor surface cover 206.

The design of a touch sensor to be operated by the thumb may be challenging because the contact patch between the thumb and sensor is large relative to the absolute size of the sensor. The capacitive sensors 210 may incorporate arrays of surface electrodes that couple capacitively (electrostatically) to a user's finger. A single sensing circuit is electronically switched among the typically large number of elements within the electrode array, making individual capacitance measurements to locate those electrode sites most affected by finger presence and thereby estimate the position of the finger. However, in a thumb sensor comprising a physically small array of many elements, most of the elements would be similarly affected by the thumb. Thus, a high electrode count may generally not be helpful.

Simpler capacitive sensing devices giving an analog output for proximity or 1-dimensional lateral position have been available for many decades. These have often been based on mutual capacitance, a sinewave electrode excitation, and synchronous detection. While this does eliminate the need for multiplexing among a large number of electrodes and therefore improves response speed, it potentially reduces the spatial resolution of the sensor.

In contrast, optical touch sensors can provide increased resolution. However, optical sensors cannot easily differentiate true contact from proximity. A digit very near the touch sensing surface may still operate the optical sensor. Perhaps most significantly, the range of motion that can be tracked by a single optical sensor is limited to approximately twice the size of the thumb contact patch.

The hybrid capacitive and optical sensor shown in FIGS. 4A and 4B is a sensor fusion approach that capitalizes on the strengths and overcomes the weaknesses of each component sensor. Specifically, the hybrid sensor provides true touch detection and fine scale motion tracking over an acceptably large tracking range.

Operation of the invention may be based on four principal concepts:

1. Combination of both capacitive and optical sensor measurements.
2. An electrode geometry incorporating a single sense electrode surrounded by multiple, simultaneous drive electrodes,
3. Multi-frequency sine wave or code-division digital excitation, and
4. A resilient insulating layer between the sensor electrodes and the user's thumb.

One possible geometry for the sensor incorporates four drive electrodes D1-D4 surrounding a single sense electrode S co-located with the optical sensor. Each of the closely spaced drive electrodes subtends approximately one quarter of the annulus surrounding the circular sense electrode.

The drive electrodes are simultaneously excited with different signals; a weighted sum of these signals is coupled into the sense electrode. The sense electrode signal is then amplified and demodulated to extract the four coupling parameters (mutual capacitances) (D1;S), (D2;S), (D3;S), and (D4;S).

Because of the large parasitic capacitance, it is likely that the thumb-presence signal will be a small change on top of a large signal; this causes dynamic range problems in the amplifier and demodulator stages. This problem may be reduced by using counterphase drive signals that cancel one another when all mutual capacitances are equal.

Thus the thumb position is represented by a differential signal that appears as a deviation from symmetry.

For example, the four drive signals might be:

$$D1 = \sin(\omega_1 t) + \sin(\omega_2 t) + 0.01 \sin(\omega_3 t)$$

$$D2 = \sin(\omega_1 t) - \sin(\omega_2 t) + 0.01 \sin(\omega_3 t)$$

$$D3 = -\sin(\omega_1 t) + \sin(\omega_2 t) + 0.01 \sin(\omega_3 t)$$

$$D4 = -\sin(\omega_1 t) - \sin(\omega_2 t) + 0.01 \sin(w_3 t).$$

A synchronous demodulator operating at frequency $\omega_1$ will respond to the y-axis thumb position, a synchronous demodulator operating at frequency $\omega_2$ will respond to the x-axis thumb position. At frequency $\omega_3$, the system is single-ended (not differential), but the signal level is reduced by a factor of 100 to assist with amplifier dynamic range issues. A synchronous demodulator operating at frequency $w_3$ will respond to thumb proximity. All three demodulators operate simultaneously on the single sensor input (i.e. no multiplexing is required) and very high sensor data rates (e.g. kilohertz) are possible, limited only by signal-to-noise performance.

An alternative to the analog sine wave excitation described above is orthogonal binary code drive. In this case each drive signal is a digital (on/off) pulse train. A correlation detector substitutes for the synchronous demodulator, giving an output proportional to the analog level of the sensor signal which is coherent with the appropriate code pattern. It may still be possible to use counter-phase drive techniques to neutralize the parasitic capacitances. This system is advantageous because it supports spread-spectrum methods and does not require analog drive components. It may be implemented in a Field-Programmable Gate Array (FPGA) with only a single external amplifier and A-to-D converter.

Incorporating a resilient surface layer provides a force-sensitive response when the thumb is in contact with the device. By using a suitable closed-cell foam or similar material, force is converted to a small displacement suitable for capacitive sensing. This additional pressure information may enable a richer control response and gesture vocabulary.

As noted, to provide support for addressing the sensor overshadowing problem, the capacitive sensor is supplemented by an optical sensor (in the center of the electrode geometry) similar to that found within optical mice. The optical sensor may augment the abilities of the device in at least one way. In the case where all capacitive sensor electrodes are fully covered by the thumb or finger (sensor overshadowing), and a fully flattened thumb or finger slide is conducted, whereby throughout the slide, the electrode plates continue to remain completely covered by the thumb or finger, the capacitive system may be unable to provide updated position tracking information. The optical system will then take over for the determination of the current tracking position, having the ability to detect and track this type of motion, as the laterally sliding surface of the thumb or finger will be visible through the aperture and accessible to optical motion tracking, regardless of the amount of overshadowed coverage of the sensor. The ability of the optical sensor to track such movements provides the user with finer and more robust control of the interface through a wider range of motions.

In addition to aiding motion tracking when the capacitive sensor is underdetermined, in any particular embodiment the optical or capacitive data may have better accuracy for one type of sensing over another. For example, in one embodiment, the optical sensor excels at velocity angle detection but may be relatively poor at velocity detection. In this embodiment, the capacitive data is hybridized with the optical data in the primary filter. This yields superior results when compared to either the optical input or capacitive input acting alone.

Figure 7:
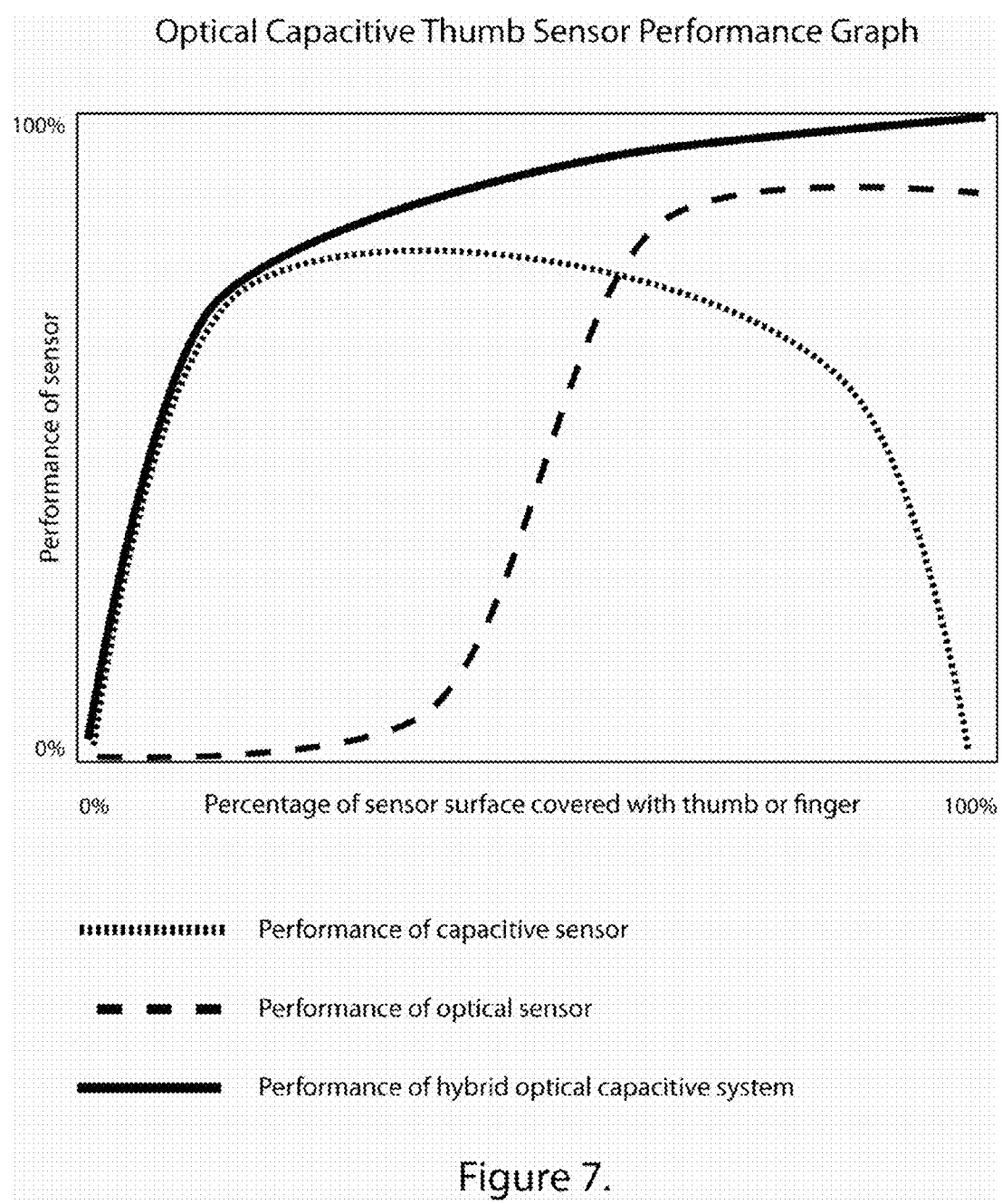
FIG. 7 is a graph illustrating the comparative performance of optical and capacitive sensor subsystems, and of a combined hybrid system, with respect to area coverage of sensor surface with thumb or finger.
Figure 8A:
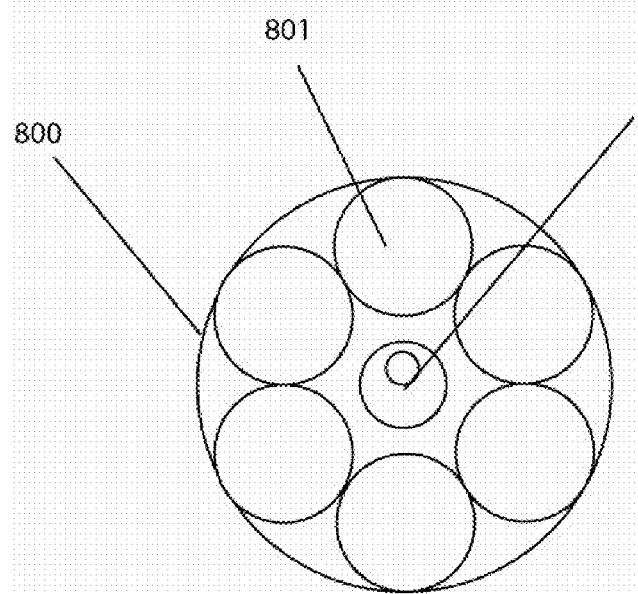
FIGS. 8A-8D are a planar view illustrations of a radial sensor pattern with elliptical capacitive electrodes, arranged in a honeycomb pattern, with and without optional optical aperture.
Figure 8B:
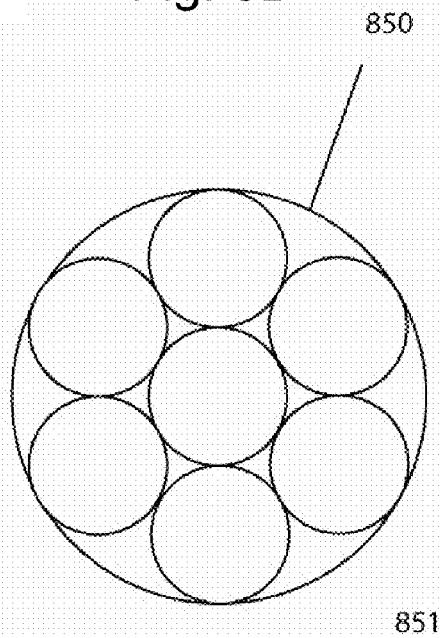
Figure 8C:
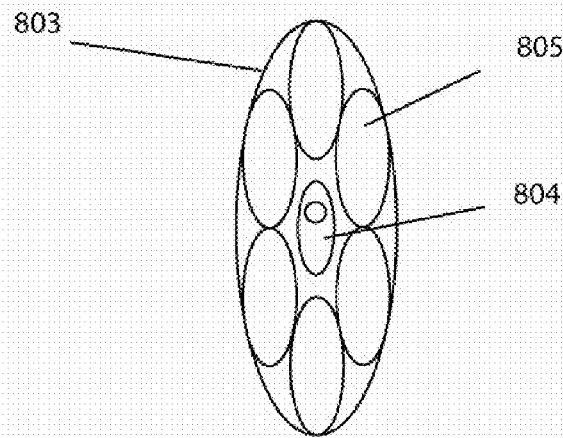
Figure 8D:
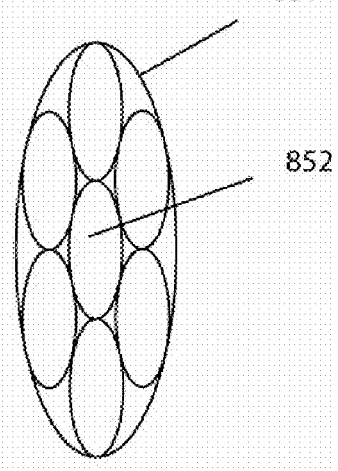
Figure 9A:
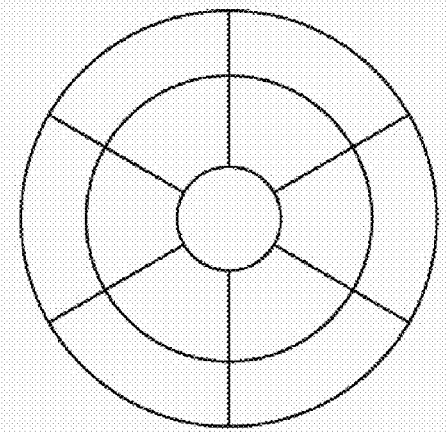
FIGS. 9A-9D are planar view illustrations of a radial sensor pattern with radially divided sectors, further divided along circular radii, with and without optical aperture.
Figure 9B:
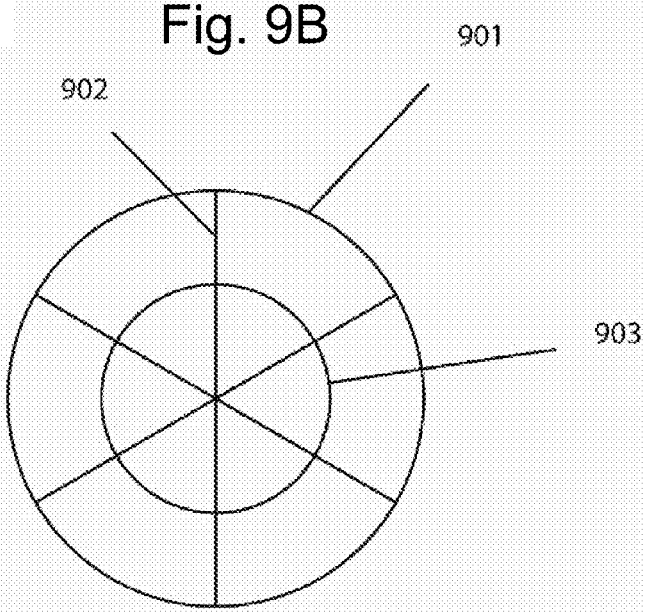
Figure 9C:
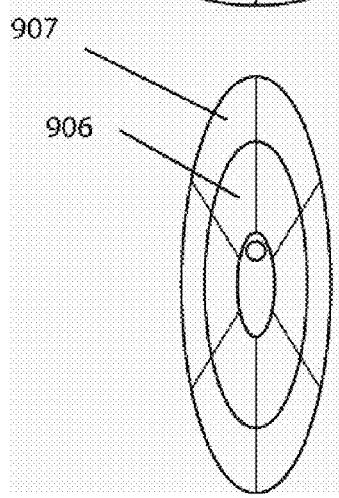
Figure 9D:
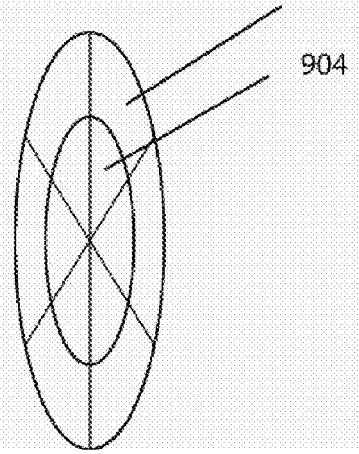

Referring to FIG. 7, wherein a graph represents the comparative performance advantages of optical and capacitive sensor systems, and the performance of a combined optical capacitive hybrid thumb sensor system, with respect to the percentage of sensor surface 102 covered by a thumb or finger.

In the proposed hybrid scheme, the capacitive sensors are used primarily for touch detection and absolute position information in three dimensions. The force and absolute position information may allow the user to execute, for example, a page up or page down gesture with a momentary but forceful contact with the upper or lower periphery of the touch-sensing region. The optical sensor provides higher resolution measurements along the surface of the sensor and indication of approach.

To avoid any acquisition delays, the optical sensor may be locked into an acquisition mode in response to a touch detected by the capacitive sensors. Reducing the acquisition time in this manner can improve the performance in detecting rapid (e.g. swiping) motion gestures.

As noted above, the performance of a single optical touch sensor designed for operation by a user's thumb may be limited by the fact that the sensor gathers optical data at a stationary point and the range of motion of the user's thumb exceeds the width of the thumb. That is, as the user moves his thumb towards the outer extents of the thumb's range, the sensor loses optical contact with the thumb, and the movement of the thumb can no longer be measured.

In one embodiment the invention extends the range of thumb motion that can be tracked by providing multiple optical touch sensors. In one variation, three sensors are arrayed along the direction of maximum anticipated movement (along the arc of motion corresponding to articulation of the carpo-metacarpal joint). Preferably, the separation between adjacent sensors is slightly less than the width of the thumb contact patch.

Additional overlap between adjacent optical sensors can provide redundant (and potentially more accurate) measurements and ease the "handoff" of measurement from one sensor to another.

In another variation of the invention, a single optical emitter-receiver pair is optically divided to emerge and collect through multiple ports. The splitting is achieved using beam-splitters or an integral imaging (i.e. array of convex lenses forming a "fly's eye" lens). The number and spacing of the ports or lenses is preferably as described above.

In either variation of the invention, the optical sensor(s) can also be used to acquire biometric data from the user. For example, the sensors can measure heart rate or skin temperature.

The capacitive sensors and optical sensors may take the form of many different shapes and configurations on the thumb sensor surface cover. FIGS. 8-13 illustrate just a few possibilities. FIGS. 8A-8D show seven sensors arranged with three running down the center and the remaining four on either side. All of the sensors shown in FIGS. 8-13 may be capacitive sensors or, for the hybrid situation, the center sensor may be an optical sensor or in the case of multiple optical sensors discussed about, all three sensors running down the center may all be optical sensors.

Referring to FIGS. 8 through 13, there may be particular or novel designs or patterns governing the particular shapes, sizes, and arrangements of the capacitive electrodes on the sensor surface 102, with and without an optical sensor aperture, which augment or underly the overall performance of a thumb sensor system. The arrangement may take various overall forms, including radial or grid pattern.

The radial pattern is designed to place greater capacitive sensitivity at the center of the sensor surface. In the radial pattern, the point at which several electrode plates meet lies at the center of the sensor surface. This common meeting point provides enhanced sensitivity at the central junction point, where a number of electrodes may come into contact with the thumb or finger tip over a small area of measurement. Larger thumb or finger contact surface with more sensors proportionally enhances signal strength C=A/d and subsequently reduces measurement noise and allows the sensor to facilitate greater accuracy as a control device.

A grid pattern may have an advantageous property such that sample points corresponding to electrode placement fall along regular intervals, and are aligned to axes. This is advantageous in the sense that it may provide a more predictable tracking pattern, and may lend well to algorithmic simplification.

Referring to FIGS. 8 through 13, a set of novel sensor designs are described. In each figure, the circular diagrams represent a given design, depicted with a square aspect ratio. The elliptical shape diagrams on the bottom half of each figure represent the same design as the figure directly above it, but given in an aspect ratio that more closely reflects its manifestation when embedded into sensor surface 102. The circular diagrams are not representational of the thumb sensor surface 102, but are included such that inherent symmetries in a given pattern may be clearly described. Each sensor design allows for an optical hybrid version as well as a pure capacitive version. Examples of both are given in each figure, side by side.

Referring to FIGS. 8A-8D, a novel radial design is described. This design is arranged by situating a set of six electrically conductive, identically sized, sensor disks 801 into a compact form tangent to a seventh central sensor. This design may exist in optical hybrid form 803, or pure capacitive form 851. The optical hybrid replaces central electrode plate 852 with optical aperture 804. Several advantage may be inherent to this particular sensor design. One may in its several symmetries along axes at multiples of 30 degrees, including the major x and y axes. The relatively large surface area of the individual electrode plates enhances the ability of this particular arrangement to measure capacitance of more distance objects. This greater distance measuring property greatly enhances the ability for three dimensional algorithms to operate well. The relatively larger capacitance measurement reduces noise levels. Additionally, the elliptical shape of the edges offers a smoother transition between electrode plates as a finger or thumb slides across the sensor surface. Also, the elliptical shape enhances the accuracy of thumb or finger distance estimation results by allowing center of mass computations to be better approximated by a point, in the case of a disk, or a line segment, in the case of an ellipse.

Referring to FIGS. 9A-9D, a novel radial design is described. This design is defined by radially dividing a disk 901 at regular angular intervals 902 into a number of sectors. In this example six sectors are illustrated but more or fewer may be chosen. The sectors are further divided along lines 903 at specific radii. The radii may be chosen such that inner sector 904 and outer sector 905 are equal in area. This may equalize the signal response of each electrode plate. An optical version may be constructed by similar means, but by cutting out an adequate sized aperture. Electrode plates 906 and 907 may be computed to equal area.

Referring to FIG. 10A-10F, a novel radial star design is described. This design is defined by geometrically generating a regular polygonal N-pointed "star" pattern. The function of the design may be to reduce abrupt transitions between adjacent electrode plates, to equalize capacitive response due to surface area, to increase linearity of transitions, and therefore the regularity and predictability of sensor measurements, of an object such as a thumb or finger sliding across the sensor surface. The reduction of abruptness of transition boundaries may result in a more consistent data stream and may result in a smoother overall point motion tracking result. The example shows a star pattern with six points, but it should be understood that the design may function as described with any number of points. The number of points of this design has been chosen due to the higher number of triangular symmetries involved.

Figures 10E, 10F:
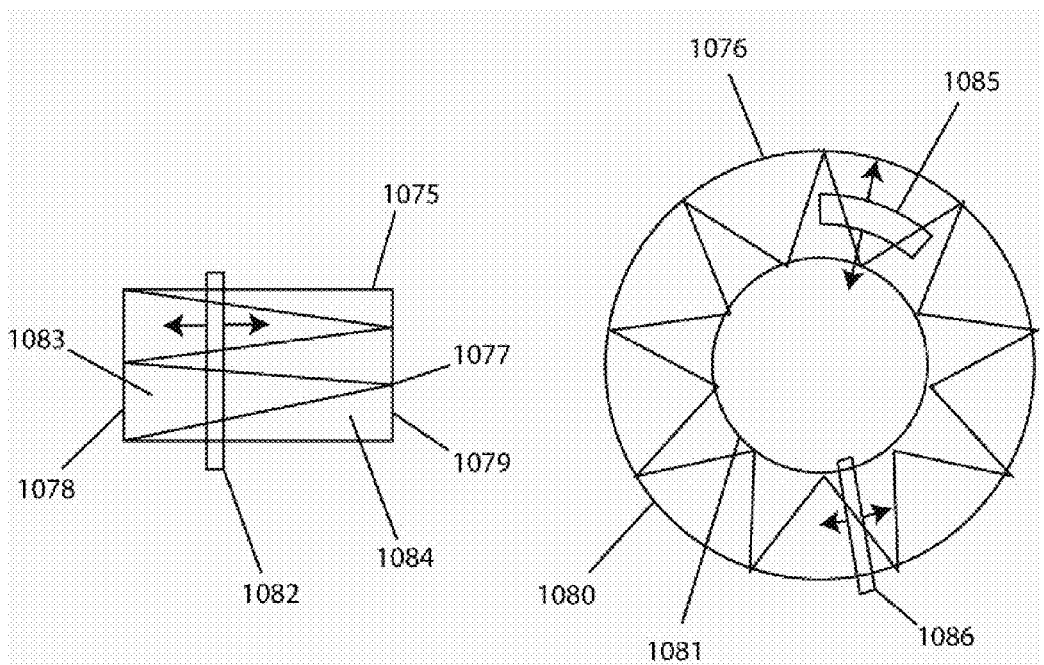
FIGS. 10E-10F are a supplementary FIGS. 10A-D intended to elaborate on the description of the particular arrangement of electrode plates.
Figures 11C, 11D:
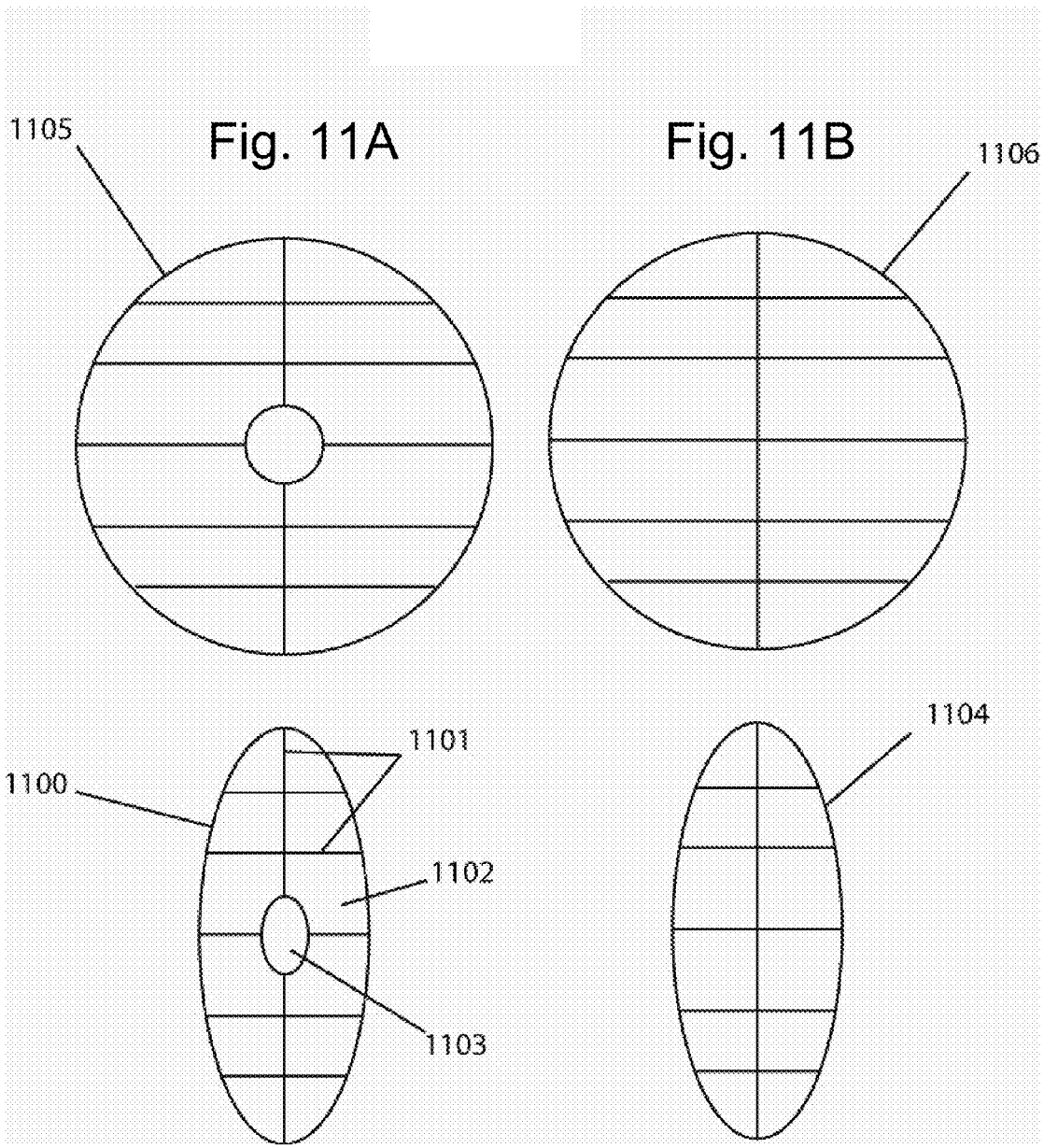

FIGS. 10E and 10F illustrate a mapping between a well-known rectangular "backgammon" sensor pattern 1075, and a novel radial arrangement 1076 of the same pattern. Under this mapping, edge 1078 and edge 1079, in the rectangular mapping, correspond to edge 1080 and edge 1081 in the radial mapping. The capacitive electrode plates 1083, 1084 are interleaved via elongated points 1077 that extend from one end of the field 1078 to the other 1079. A well-known feature of this design is such that if a test object 1082 slides between edge 1078 and edge 1079, measured capacitance on plates 1083 and 1084 will vary linearly proportional to the position of the test object, according to the surface area of the plates covered by test object 1082.

This property is preserved in the novel radial mapping 1076 whereby the effect on measured capacitance by a test object 1085 sliding radially inward or outward is approximately linear. Thus the star pattern 1076 is a radial mapping of the backgammon pattern 1075. Further, it should be evident that this linearity property holds in the case where the angular position of a test object 1086 varies. Referring again to FIG. 10, the inner radius at point 1002 of the star pattern 1000 may be chosen, along with the radius of the optical aperture 1004, such that surface area of electrode plates 1005 and 1006 are equal, with respect to their elliptical mapping under 1009. The inner radius 1010 of the star design 1003 may similarly be chosen such that all electrode plates 1007 1008 are equal in area. A further desirable property of capacitive design 1003 is the common central junction 1011 of many independent inner electrodes, which may permit capacitive blending characteristics inherent in the interleaving or intermixing of many thin, pointed electrodes.

Referring to FIGS. 11A-11D, a novel grid pattern may be described which may or may not bear an optical aperture. A sensor surface 102 is divided by a set of orthogonal lines 1101 such that each electrode plate 1102 by division is approximately square in aspect ratio, and further that each electrode plate 1102 is of an equal common area. This area may be computed with or without respect to the optical aperture 1103 which may be placed in the middle of the sensor field, or another suitable arrangement of multiple optical sensors. An advantage of the regular grid arrangement is in the maximization of each electrode plate surface area over a sensor surface 102. Increasing surface area, in general, will increase capacitance measurement, and may significantly reduce noise.

Figure 12A:
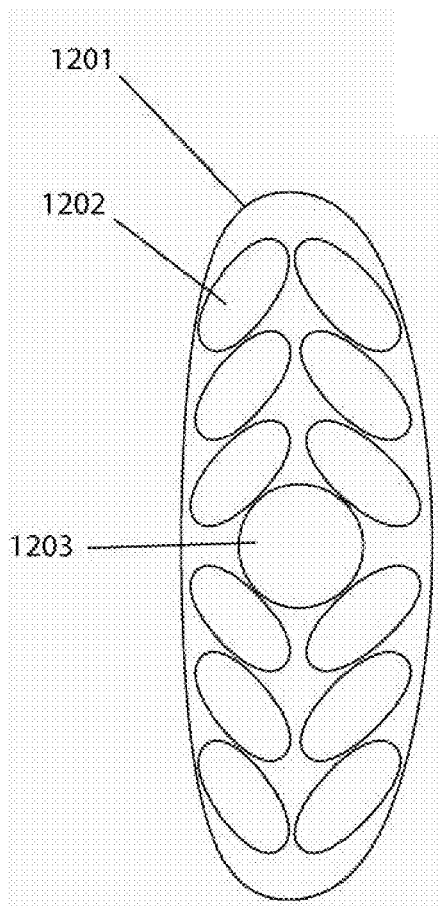
FIGS. 12A-12B are planar view illustrations of a grid sensor pattern with oblique elliptical electrode plates, with and without optical aperture.
Figure 12B:
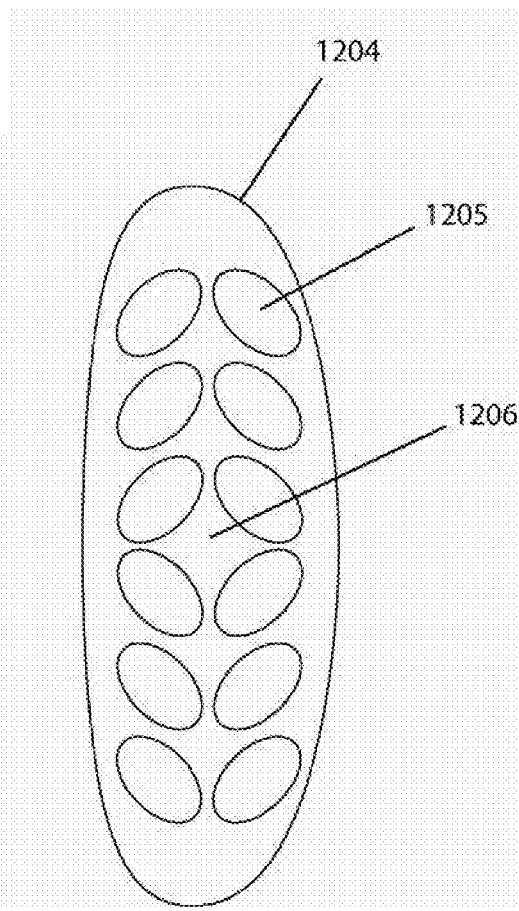

Referring to FIGS. 12A-12B, a novel grid capacitive sensor design may be described. This pattern may exist in optical hybrid 1201 or pure capacitive 1204 embodiments. An optical aperture 1203 may be placed in the center of a grid array arrangement of obliquely angled elliptical electrode sensors 1202. An arrangement without an optical sensor, 1204, may take advantage of increased available surface area, obtained by omission of the optical aperture, by a corresponding increase in electrode plate 1205 size. The elliptical shape of the electrode plates 1202, 1205, enhance the ability of the capacitive sensor to measure at a distance, and to approximate a point sample. The curved edges of the electrodes also may improve smoothness of transition between plates, as a thumb or finger is slid across the sensor surface 102.

Figures 13A, 13B:
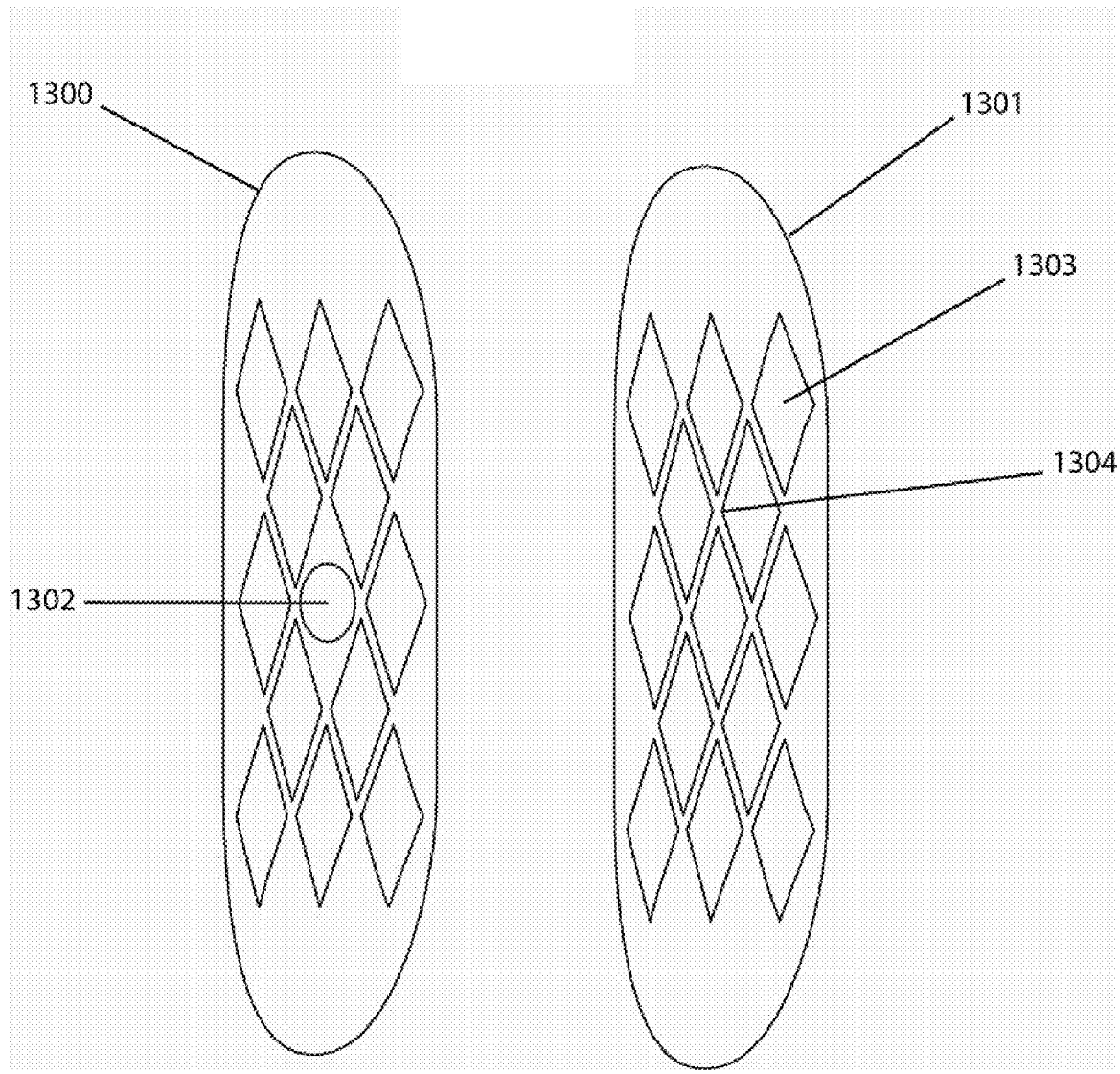
FIGS. 13A-13B are planar view illustrations of a diamond grid sensor pattern, with and without optical aperture.

Referring to FIGS. 13A and 13B, a novel diamond grid capacitive sensor design may be described, with 1300 or without 1301 an optical aperture 1302 or apertures. The interleaving of electrodes 1303 may be enhanced by making oblique angles to the major axes of motion, X, and Y. A sliding object moving solely parallel along the X axis of the sensor field will at all times encounter and cross over transition boundaries 1304 at an oblique angle. This angular or oblique transition boundary 1304 may cause measurements between adjacent electrode sensors 1303 to vary more linearly than if a regular orthogonal grid is used, where transitions across sensor electrodes are abrupt as from a step function. An identical claim may be made for the Y axis, which is rotationally symmetrical to the X axis, with respect to an adjustment of aspect ratio. The diamond pattern may accomplish the linearization of transition boundaries, and a resultant smoothing of measurement, for the case of motion parallel to the major axes, which may be a most common case, given the predominantly orthogonal arrangement of many user interface elements.

FIGS. 12A-B show twelve elongated capacitive sensors 1202 running down either side of the sensor surface 102 and a center optical sensor 1203. In some embodiments, the sensors may or may not overlap as discussed above. FIGS. 9A-D show radially oriented capacitive sensors and FIG. 13A-B show diamond shaped capacitive sensors. Either of these designs may of course also include optical sensors as well.

Figure 6:
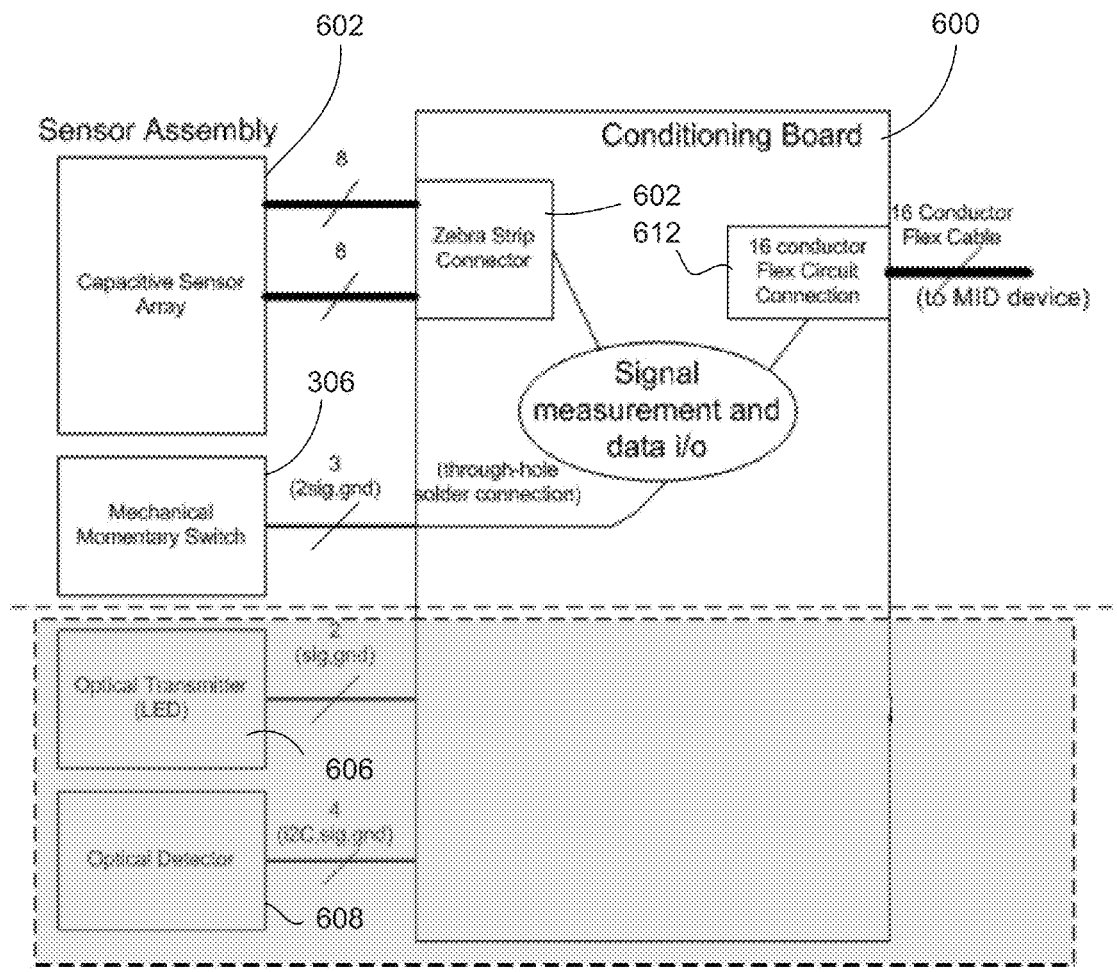
FIG. 6 is a block diagram illustrating one embodiment of the conditioning board and sensor inputs for the thumb sensor.

FIG. 6 is a block diagram illustrating one possible embodiment of operation of the present invention. A PCB or conditioning board 600 may receive inputs and send control outputs to/from the capacitive sensor array 602, the mechanical dome switches 604, the optical transmitter (LED) 606 and the optical detector 608. In some embodiments the optics may be optional. The capacitive sensor array may be connected through a zebra strip connector as previously discussed. All signals and data measurement may be continuously measured, digitized and organized into a serial data stream for off-device processing through a flex connector onto the MID.

Software may use the data process the data by, for example, a Finite Impulse Response (FIR) filter to perform position control. The data is further processed using gesture recognition algorithm to perform gesture controls. The gesture recognition may be performed on the MID CPU due to the complexity. The CPU may be a conventional microprocessor including, but not limited to, an Intel Corporation x86, Pentium, Itanium family, or Atom family microprocessor, a Motorola family microprocessor, or the like running any suitable operating system. For example, one embodiment of the present invention utilizes Microsoft Windows®. as the operating system for computer system 400. In another embodiment, other operating systems such as, but not limited to, the Apple Macintosh® operating system, the Linux operating system, the Unix operating system, the 3Com Palm operating system, or the like may also be use in accordance with the teachings of the present invention.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
   a touchpad shaped to accommodate a thumb, the touchpad positioned on a mobile computer device;
   an array of capacitive sensors associated with the touchpad to detect thumb gestures to control a cursor in an x and y direction for the mobile computer device;
   a pressure sensor mechanism associated with the touchpad to detect thumb pressure as a Boolean input for the mobile computer device;
   an optical sensor associated with the touchpad to optically detect a thumb; and
   wherein the optical sensor is positioned near the center of the touchpad with the array of capacitive sensors surrounding the optical sensor.

2. The apparatus are recited in claim 1 wherein the pressure sensitive mechanism comprises a tactile switch under the touchpad.

3. The apparatus as recited in claim 1 wherein the pressure sensitive mechanism comprises a pair of tactile switches, one at either end of the touchpad.

4. The apparatus as recited in claim 1 wherein the touchpad is located on an upper side portion of the mobile computer device at a position where a thumb would naturally fall when holding the mobile computer device.

5. The apparatus as recited in claim 1 further comprising:
   a zebra strip connector to organize outputs from each sensor in the array of capacitive sensors.

6. The apparatus as recited in claim 1 wherein individual capacitive sensors in the array of capacitive sensors is generally elliptical in shape and are positioned along either side of the touchpad.

7. The apparatus as recited in claim 1 wherein individual capacitive sensors in the array of capacitive sensors are generally diamond in shape.

8. The apparatus as recited in claim 1 wherein individual capacitive sensors in the array of capacitive sensors are generally oval in shape.

9. The apparatus as recited in claim 1 further comprising:
   a capacitive sensor co-located with the optical sensor.

10. An apparatus, comprising:
    a touchpad shaped to accommodate a thumb, the touchpad positioned on a mobile computer device;
    an array of capacitive sensors associated with the touchpad to detect thumb gestures to control a cursor in an x and y direction for the mobile computer device;

a pressure sensor mechanism associated with the touchpad to detect thumb pressure as a Boolean input for the mobile computer device; and a plurality of optical sensors associated with the touchpad to optically detect thumb movements along a length of the touchpad, the plurality of optical sensor are positioned down a center line of the touchpad with the array of capacitive sensors surrounding the optical sensors.

11. A system, comprising:

a hand-held computer device;

a thumb touchpad located on an upper side panel of the computer device;

an array of capacitive sensors associated with the touchpad;

at least one optical sensor associated with the touchpad, wherein the array of capacitive sensors and the optical sensor operate to detect thumb gestures to control a cursor in an x and y direction for the computer device; and a pressure sensor mechanism associated with the touchpad to detect thumb pressure as a Boolean input for the computer device, further wherein the thumb touchpad comprises:

a saddle shaped outer cover with the array of capacitive sensors distributed therewith;

an aperture in the cover for allowing light to pass through for the optical sensor;

a light source located behind the aperture; and a light detector located behind the aperture.

12. The system as recited in claim 11 herein the thumb touchpad further comprises:

a zebra strip connector to organize outputs from each sensor in the array of capacitive sensors.

13. The system as recited in claim 11 wherein the pressure sensitive mechanism comprises a tactile switch under the touchpad.

14. The system as recited in claim 11 wherein the pressure sensitive mechanism comprises a pair of tactile switches, one at either end of the touchpad.

15. The system as recited in claim 11 wherein the Boolean input may comprise a click input.

* * * * *

UNITED STATES PATENT AND TRADEMARK OFFICE
CERTIFICATE OF CORRECTION

PATENT NO.        : 8,907,897 B2                                    Page 1 of 1
APPLICATION NO.   : 12/650582
DATED             : December 9, 2014
INVENTOR(S)       : Bran Ferren et al.

It is certified that error appears in the above-identified patent and that said Letters Patent is hereby corrected as shown below:

In the claims

In column 16, line 37, in claim 2, delete "are" and insert -- as --, therefor.

Signed and Sealed this
Twelfth Day of May, 2015

Michelle K. Lee
*Director of the United States Patent and Trademark Office*